(12) United States Patent
Nelson

(10) Patent No.: US 12,177,960 B2
(45) Date of Patent: Dec. 24, 2024

(54) HIGH FREQUENCY AND HIGH POWER THIN FILM COMPONENT

(71) Applicant: KYOCERA AVX Components Corporation, Fountain Inn, SC (US)

(72) Inventor: Cory Nelson, Simpsonville, SC (US)

(73) Assignee: KYOCERA AVX Components Corporation, Fountain Inn, SC (US)

( * ) Notice: Subject to any disclaimer, the term of this patent is extended or adjusted under 35 U.S.C. 154(b) by 295 days.

(21) Appl. No.: 17/891,197

(22) Filed: Aug. 19, 2022

(65) Prior Publication Data
US 2023/0071682 A1   Mar. 9, 2023

Related U.S. Application Data

(60) Provisional application No. 63/242,077, filed on Sep. 9, 2021.

(51) Int. Cl.
| | |
|---|---|
| *H05K 1/02* | (2006.01) |
| *H05K 1/11* | (2006.01) |
| *H05K 1/18* | (2006.01) |
| *H05K 3/30* | (2006.01) |
| *H05K 3/40* | (2006.01) |

(52) U.S. Cl.
CPC .......... *H05K 1/0203* (2013.01); *H05K 1/11* (2013.01); *H05K 1/181* (2013.01); *H05K 3/303* (2013.01); *H05K 3/4007* (2013.01); *H05K 2201/066* (2013.01)

(58) Field of Classification Search
CPC .......... H01G 2/08; H01G 4/012; H01G 4/228; H01G 4/30; H01G 4/33; H01G 4/38; H01G 9/004; H01G 9/012; H01G 9/025; H01G 9/08; H01G 9/15; H05K 1/0203–0204; H05K 1/0209; H05K 1/0243; H05K 1/11; H05K 1/185; H05K 3/30; H05K 3/32; H05K 3/341; H05K 7/20; H05K 7/2039; H05K 7/205; H05K 7/209; H05K 2201/10015; H05K 2201/066; H01L 29/94; H01L 29/66181; H01L 28/20; H01L 28/40; H01L 23/36; H01L 23/367; H01L 23/642–66

See application file for complete search history.

(56) References Cited

U.S. PATENT DOCUMENTS

| | | | |
|---|---|---|---|
| 8,665,059 B2 | 3/2014 | Korony et al. | |
| 10,660,238 B2 | 5/2020 | Durgin | |
| 11,664,159 B2 * | 5/2023 | Demcko | H01G 4/30 |
| | | | 361/274.3 |
| 2010/0001294 A1 * | 1/2010 | Faller | H05K 1/053 |
| | | | 438/26 |

(Continued)

*Primary Examiner* — Amir A Jalali
(74) *Attorney, Agent, or Firm* — Dority & Manning, P.A.

(57) ABSTRACT

A surface mount component can include a first substrate and a second substrate arranged adjacent the first substrate to form a monolithic body. At least one of the first substrate or the second substrate can include a thermally conductive material that is electrically insulating. A thin film component can be arranged between the first substrate and the second substrate. A first terminal can be formed over a first end of the monolithic body. A second terminal can be formed over a second end of the monolithic body that is opposite the first end. A heat sink terminal can contact the thermally conductive material of the at least one of the first substrate or the second substrate.

26 Claims, 10 Drawing Sheets

(56) References Cited

U.S. PATENT DOCUMENTS

| | | | | |
|---|---|---|---|---|
| 2019/0378891 A1* | 12/2019 | Nelson | | H01C 7/003 |
| 2022/0346222 A1* | 10/2022 | Nelson | | H05K 1/0243 |
| 2022/0352391 A1* | 11/2022 | Nelson | | H01G 4/40 |
| 2022/0367733 A1* | 11/2022 | Nelson | | H01G 4/005 |
| 2022/0418081 A1* | 12/2022 | Nelson | | H05K 1/0206 |
| 2023/0298815 A1* | 9/2023 | Demcko | | H01G 4/38 |
| | | | | 361/274.3 |

* cited by examiner

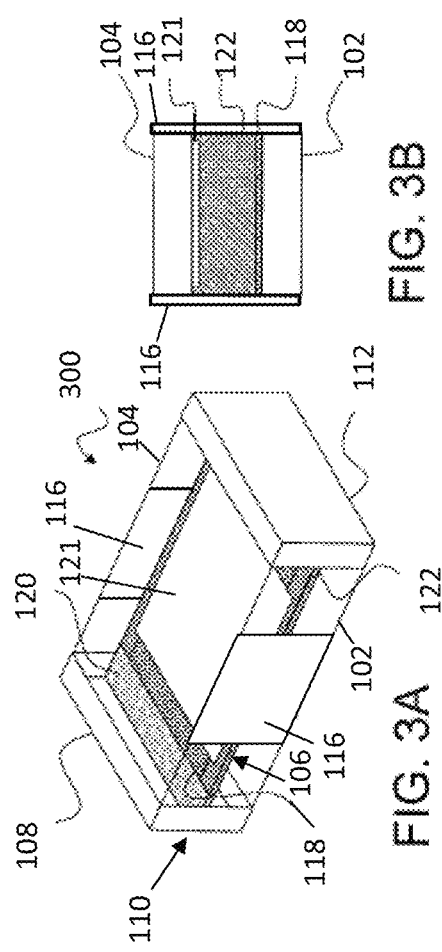

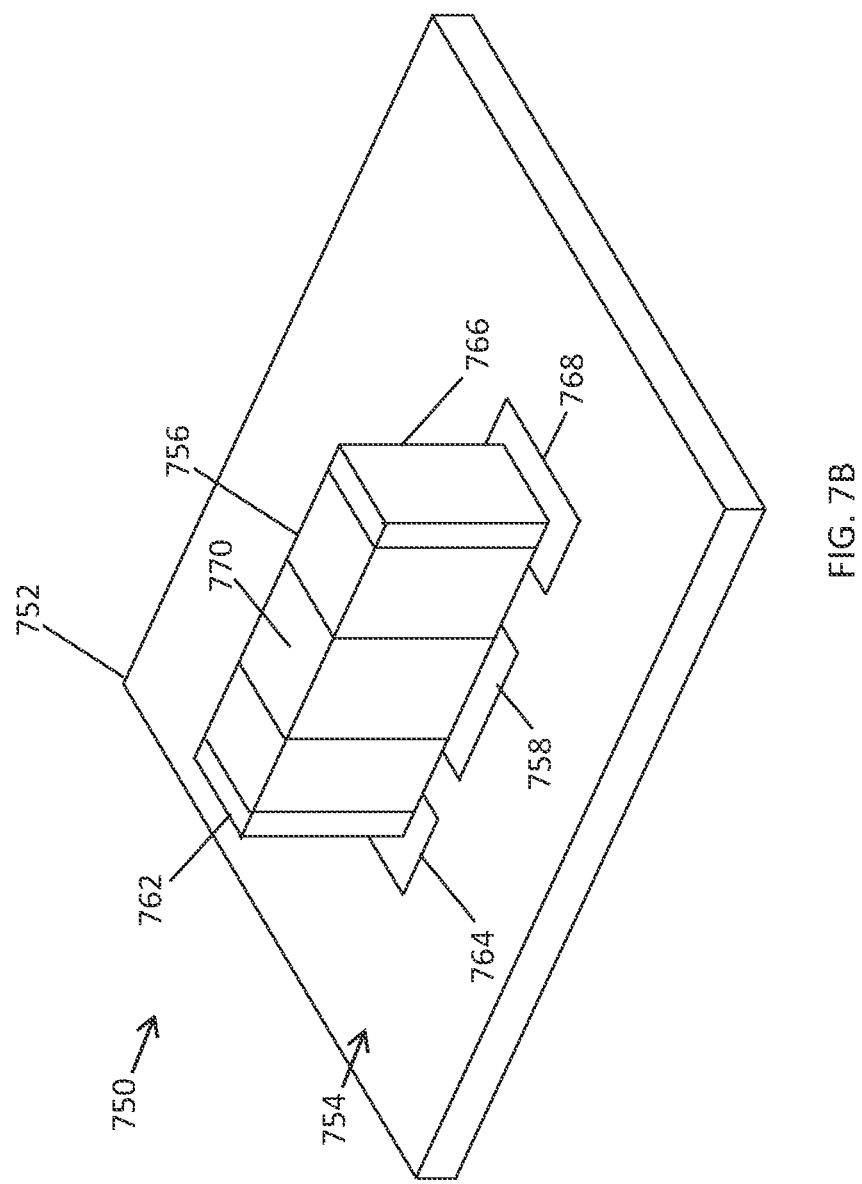

HIGH FREQUENCY AND HIGH POWER THIN FILM COMPONENT

CROSS REFERENCE TO RELATED APPLICATION

The present application claims filing benefit of U.S. Provisional Patent Application Ser. No. 63/242,077 having a filing date of Sep. 9, 2021, which is incorporated herein by reference in its entirety.

BACKGROUND OF THE INVENTION

High frequency radio signal communication has increased in popularity. For example, the demand for increased data transmission speed for wireless connectivity has driven demand for high frequency components, including those configured to operate at 5G spectrum frequencies. At the same time, a trend towards miniaturization has increased the demand for smaller passive components. Miniaturization of passive components, however, generally undesirably reduces power handling capacity. A compact, high frequency component, such as a resistor, that is capable of operating at elevated power levels would be welcomed in the art.

SUMMARY OF THE INVENTION

In accordance with one embodiment of the present disclosure, a surface mount component can include a first substrate and a second substrate arranged adjacent the first substrate to form a monolithic body. At least one of the first substrate or the second substrate can include a thermally conductive material that is electrically insulating. A thin film component can be arranged between the first substrate and the second substrate. A first terminal can be formed over a first end of the monolithic body. A second terminal can be formed over a second end of the monolithic body that is opposite the first end. A heat sink terminal can contact the thermally conductive material of the at least one of the first substrate or the second substrate.

A component assembly can include a circuit board having a mounting surface. A surface mount component can be mounted to the mounting surface. The surface mount component can include a first substrate and a second substrate arranged adjacent the first substrate to form a monolithic body. At least one of the first substrate or the second substrate can include a thermally conductive material that is electrically insulating. A thin film component can be arranged between the first substrate and the second substrate. A first terminal can be formed over a first end of the monolithic body. A second terminal can be formed over a second end of the monolithic body that is opposite the first end. A heat sink terminal can contact the thermally conductive material of the at least one of the first substrate or the second substrate.

In accordance with one embodiment of the present disclosure, a method of forming a surface mount component can include forming a thin film component over a first substrate and arranging a second substrate adjacent the first substrate to form a monolithic body. At least one of the first substrate or the second substrate comprises a thermally conductive material that is electrically insulating. The method can include depositing a first terminal over a first end of the monolithic body; depositing a second terminal over a second end of the monolithic body that is opposite the first end; and depositing a heat sink terminal contacting the thermally conductive material of the at least one of the first substrate or the second substrate.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended figures, in which:

FIG. 1 is a perspective view of one embodiment of a portion of a surface mount component including a thin film component, a heat sink terminal, and a substrate including a thermally conductive, electrically insulative material in accordance with aspects of the presently disclosed subject matter;

FIG. 2 is a partially assembled perspective view of the surface mount component of FIG. 1;

FIG. 3A is a fully assembled perspective view of the surface mount component of FIG. 1;

FIG. 3B is a cross-sectional view of the surface mount component of FIG. 1;

FIG. 7B illustrates a component assembly including the surface mount component of FIG. 3C mounted in a vertical configuration according to aspects of the present invention.

Figure 3C:
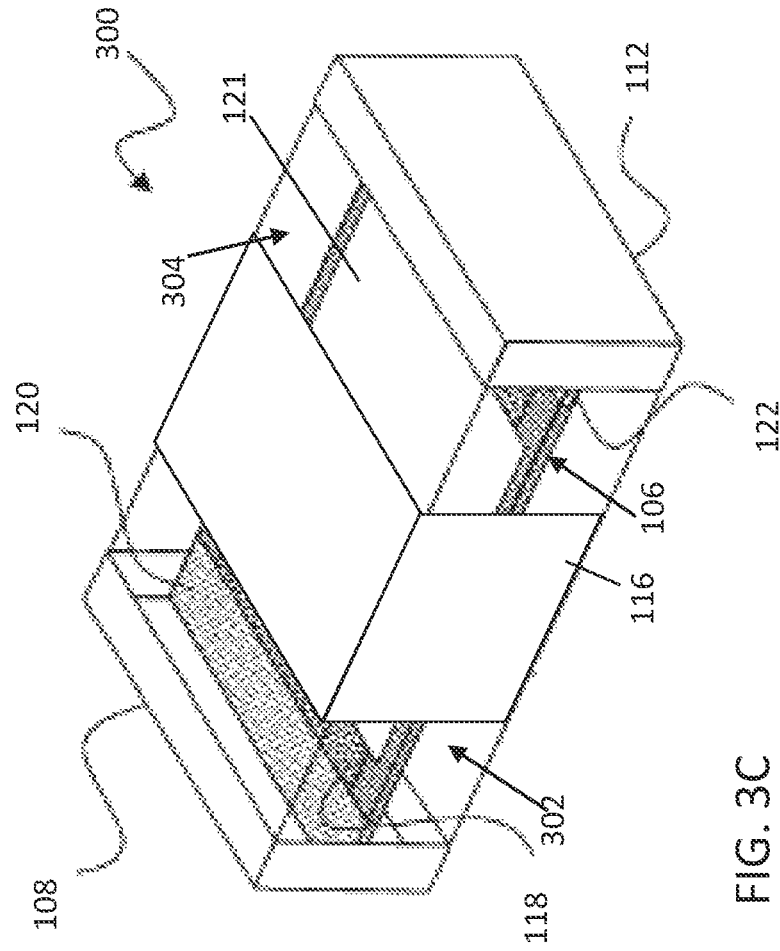
FIG. 3C is a perspective view of another embodiment of a surface mount component having a wrap-around heat sink terminal in accordance with aspects of the presently disclosed subject matter.

Repeat use of reference characters in the present specification and drawings is intended to represent same or analogous features or elements of the invention.

DETAILED DESCRIPTION OF REPRESENTATIVE EMBODIMENTS

It is to be understood by one of ordinary skill in the art that the present discussion is a description of exemplary embodiments only, and is not intended as limiting the broader aspects of the present invention, which broader aspects are embodied in the exemplary construction.

Generally speaking, the present invention is directed to a surface mount component having excellent heat dissipating capabilities. A surface mount component can include a first substrate and a second substrate arranged adjacent the first substrate to form a monolithic body. At least one of the first substrate or the second substrate can include a thermally conductive material that is electrically insulating, such as aluminum nitride or beryllium oxide. A thin film component may be arranged between the first substrate and the second substrate. A first terminal may be formed over a first end of the monolithic body. A second terminal may be formed over a second end of the monolithic body that is opposite the first end. A heat sink terminal can contact the thermally conductive material of the first substrate and/or the second substrate.

The heat sink terminal can have a variety of configurations. For example, the heat sink terminal can be formed over one or more side surfaces of the monolithic body. As another example, the heat sink terminal can be formed over a bottom surface of the monolithic body. As a further example, the heat sink terminal can be formed over a top surface of the monolithic body. In some embodiments, the side surfaces of the monolithic body are free of the heat sink terminal. Further, in some embodiments the top surface of the monolithic body is free of the heat sink terminal.

As used herein, a layer that is "formed over" an object can include the layer being directly formed on the object and the layer being formed over one or more intermediate layers that are between the layer and the object. Further, formed "over" a bottom surface refers to outward from a center of the component.

In some embodiments, the thin film component can be or include a thin film resistor including a resistive layer. The thin film resistor may be configured to exhibit a variety of resistance values, as desired. For example, in some embodiments, the thin film resistor may have a resistance that ranges from about 1Ω to about 2,000Ω, in some embodiments from about 2Ω to about 1,000Ω, in some embodiments from about 5Ω to about 750Ω, in some embodiments from about 10Ω to about 500Ω, in some embodiments from about 25Ω to about 400Ω.

The resistive layer of the thin film resistor may be formed using a variety of thin film techniques, including photolithography or any other suitable patterning technique, etching, PECVD (Plasma Enhanced Chemical Vapor Deposition) processing, or other additive and/or subtractive techniques. The resistive layer of the thin film resistor may be formed from a variety of suitable resistive materials. For example, the resistive layer may include tantalum nitride (TaN), nickel chromium (NiCr), tantalum aluminide, chromium silicon, titanium nitride, titanium tungsten, tantalum tungsten, oxides and/or nitrides of such materials, and/or any other suitable thin film resistive materials.

The resistive layer may have any suitable thickness. For example, in some embodiments, a thickness of the resistive layer may range from about 0.001 μm to about 1,000 μm, in some embodiments from about 0.01 μm to about 100 μm, in some embodiments from about 0.1 μm to about 50 μm, in some embodiments from about 0.5 μm to about 20 μm.

The thin film resistor may provide excellent frequency transmission characteristics over a broad frequency range. For example, in some embodiments, the thin film resistor can exhibit a transmission coefficient ($S_{21}$) that remains substantially constant from about 20 GHz to about 40 GHz (or greater). For example, the thin film resistor can exhibit a first transmission coefficient that varies less than 20% from about 20 GHz to about 40 GHz as compared with the transmission coefficient of the thin film resistor at 20 GHz, in some embodiments less than 10%, in some embodiments less than 5%, in some embodiments less than 2%, and in some embodiments less than 1%.

In some embodiments, the transmission coefficient of the thin film resistor may remain substantially constant over 5G spectrum frequencies. For example, in some embodiments, the transmission coefficient may vary less than about 20% across frequencies ranging from about 20 GHz to about 60 GHz, or higher, in some embodiments less than about 10%, in some embodiments less than about 5%, in some embodiments less than about 2%, and in some embodiments less than about 1%. In some embodiments, the transmission coefficient may vary less than about 20% across frequencies ranging from about 20 GHz to about 40 GHz, or higher, in some embodiments less than about 10%, in some embodiments less than 5%, in some embodiments less than about 2%, and in some embodiments less than about 1%.

As an example, in one embodiment, the transmission coefficient of the thin film resistor may be about −6.025 dB at 1 GHz, and the transmission coefficient of the thin film resistor may range from about −7.23 dB to about −5.59 dB for frequencies ranging from 1 GHz to about 30 GHz, or greater, in some embodiments from about −6.63 dB to about −5.63 dB, in some embodiments from about −6.15 dB to about −5.65 dB, and in some embodiments from about −6.09 dB to about −5.66 dB.

In some embodiments, the resistance of the thin film resistor may remain substantially constant over 5G spectrum frequencies. For example, in some embodiments, the resistance of the thin film resistor may vary less than about 20% across frequencies ranging from about 20 GHz to about 40 GHz, or higher (e.g., up to about 60 GHz), in some embodiments less than about 15%, in some embodiments less than about 10%, in some embodiments less than about 5%, and in some embodiments less than about 1%.

In some embodiments, the thin film resistor may include a frequency compensating conductive layer, which may contribute to the frequency response characteristics and/or consistent resistance of the thin film resistor. The frequency compensating conductive layer may be arranged in parallel with the resistive layer and form a capacitance therebetween.

In some embodiments, the frequency compensating conductive layer may be formed using thin film methods. For example, the frequency compensating conductive layer be formed using a variety of thin film techniques, including photolithography or any other suitable patterning technique, etching, PECVD (Plasma Enhanced Chemical Vapor Deposition) processing, or other additive and/or subtractive techniques. The frequency compensating conductive layer, however, may be formed using any suitable technique, such as printing, dipping, striping, or other techniques for forming conductive layers.

The frequency compensating conductive layer may be formed from a variety of suitable conductive materials. For example, the frequency compensating conductive layer may include aluminum, copper, gold, silver, nickel, mixtures thereof, and/or any other suitable conductive material.

The frequency compensating conductive layer may have any suitable thickness. For example, in some embodiments a thickness of the frequency compensating conductive layer may range from about 0.001 μm to about 1,000 μm, in some embodiments from about 0.01 μm to about 100 μm, in some embodiments from about 0.1 μm to about 50 μm, in some embodiments from about 0.5 μm to about 20 μm.

However, the thin film component can be or include one or more of a thin film capacitor, a thin film inductor, a thin film filter, or other suitable thin film component.

For example, a thin film capacitor can include one or more dielectric layers. As examples, the dielectric layer(s) may include one or more suitable ceramic materials. Example suitable materials include alumina (Al2O3), aluminum nitride (AlN), beryllium oxide (BeO), aluminum oxide (Al2O3), boron nitride (BN), silicon (Si), silicon carbide (SiC), silica (SiO2), silicon nitride (Si3N4), gallium arsenide (GaAs), gallium nitride (GaN), zirconium dioxide (ZrO2), mixtures thereof, oxides and/or nitrides of such materials, or any other suitable ceramic material. Additional example ceramic materials include barium titanate (BaTiO3), calcium titanate (CaTiO3), zinc oxide (ZnO), ceramics containing low-fire glass, or other glass-bonded materials.

In some embodiments, the terminals may include one or more layers. The layers may be formed from a variety of materials and using a variety of methods. For example, the terminals may correspond to one or more layers of thin film or thick-film conductive materials applied by selected formation techniques, including but not limited to printing, dipping, striping, or other techniques for forming conductive layers. Different types of conductive materials may be used. For example, thin film layers of plating (e.g., nickel, copper, tin, gold, etc.) may be formed over an initial thick-film layer of conductive paste.

In one exemplary embodiment, the terminals may include at least one organometallic layer, e.g., a layer of conductive polymer material to provide flexibility in the external terminals. Use of such material can help ensure electrical integrity is maintained during and after external forces such as mechanical or thermo-mechanical stresses are applied to a component. In one exemplary embodiment, such a conductive polymer corresponds to a polymer, resin, epoxy, polyamide, thermoset, thermoplastic, or other polymer material loaded with conductive metal particles such as, but not limited to, silver, nickel, aluminum, platinum, copper, palladium, gold, alloys of such materials or others. In some particular embodiments, such a conductive polymer is chosen to be a low temperature material such that the curing temperature is less than the curing temperature of other materials in the component, such as the adhesive or sealant layers. In addition, the conductive polymer material may be chosen such that it is capable of withstanding certain reflow temperatures in a circuit mounting environment. In one embodiment, the conductive polymer termination material is applied over a base layer of conductive metal, such as copper, nickel, or the like. In another embodiment, the conductive polymer termination layer is provided directly to the peripheral component surfaces such that the conductive polymer termination layer is in direct electrical connection with exposed portions of the internal conductive pads of a component. Still further, additional termination layers may be formed over the layer of conductive polymer termination material. For example, one or more layers of plated nickel, copper, or tin may be provided over the layer of conductive polymer termination material.

In some embodiments, one or more of the terminals may include magnetic or magnetized materials. For example, one or more of the terminals may include an outer layer over a first layer. The first layer may be magnetic or magnetized, and the outer layer may be corrosion-resistant. For example, an outer layer of gold may be disposed over a first layer of copper or steel. In other embodiments, an outer layer, such as gold, may be disposed over a non-magnetic first layer, such as a ceramic. The first layer and/or outer layer may include gold, silver, platinum, nickel, copper, steel, and/or any other suitable material.

The terminals may have a variety of suitable configurations. For example, in some embodiments, the terminals of the thin film components and the heat sink terminal may be located on the same surface of the electrically insulating beam or substrate. Such a configuration may be referred to as a "flip chip" configuration because the thin film component and heat sink terminal are formed on a "top" surface of the beam, and the beam is then flipped such that the "top" surface is mounted on the printed circuit board.

Alternatively, in other embodiments, one or more of the terminals may be disposed on other surfaces of the electrically insulating beam. This may allow the surface mounted component to be mounted in an alternative orientation. For example, in some embodiments, the thin film component may be formed on a first surface of the beam, and the terminals may wrap around the insulating beam such that they are at least partially formed on a second surface that is opposite the first surface. This may allow the second surface of the surface mounted component to be mounted to the printed circuit board such that first surface faces away from the printed circuit board and the thin film component is exposed. Such a configuration may provide improved heat dissipation away from the thin film component, for example, through convection with ambient air surrounding the thin film component.

FIGS. 1 through 3B illustrate one embodiment of a surface mount component 300 and components thereof according to aspects of the present invention. FIG. 3A illustrates the surface mount component 300 in an assembled configuration. Referring to FIGS. 1 and 2, a first substrate 102 and a second substrate 104 arranged adjacent the first substrate 102 form a monolithic body 105. At least one of the first substrate 102 or the second substrate 104 can include a thermally conductive material that is electrically insulating, such as aluminum nitride or beryllium oxide. A thin film component 106 may be arranged between the first substrate and the second substrate. Referring to FIG. 3A, a first terminal 108 may be formed over a first end 110 of the monolithic body 105. A second terminal 112 may be formed over a second end 114 of the monolithic body 106. The second end 114 may be opposite the first end 110.

One or more heat sink terminals 116 can contact the thermally conductive material of the first substrate 102 and/or the second substrate 104. In some embodiments, one of the substrates 102, 104 may be or include glass. The other of the substrates 102, 104 may be or include the thermally conductive, electrically insulating material. For example, the first substrate 102 may be or include the thermally conductive, electrically insulating material, and the second substrate 104 may be or include glass. As another example, the first substrate 102 may be or include glass, and the second substrate 104 may be or include the thermally conductive, electrically insulating material. However, in some embodiments, both of the substrates may be or include the thermally conductive, electrically insulating material. In further embodiments, additional substrates may be included. At least one of the substrates may be or include the thermally conductive, electrically insulating material. The thermally conductive, electrically insulating material may preferably be in contact with the thin film component 106 and/or a thin layer of material that is in contact with the thin film component 106.

In some embodiments, the thin film component 106 may be or include a thin film resistor including a resistive layer 118 that is electrically connected between the terminals 108, 112. For example, contact pads 120, 122 can be arranged to contact the respective terminals 108, 112. The restive layer 118 can connect with the contact pads 120, 122. In some embodiments, a frequency compensating conductive layer 121 can be arranged adjacent the resistive layer 118 for example as described below with reference to FIGS. 5A to 10.

FIG. 3B illustrates a cross sectional view of the surface mount component 300. In some embodiments, a layer of adhesive 124 may be formed over the resistive layer 118. The frequency compensation layer 121 can be formed over the adhesive 124.

The heat sink terminal 116 can have a variety of configurations. For example, the heat sink terminal can be formed over one or more side surfaces of the monolithic body. As another example, the heat sink terminal can be formed over a bottom surface of the monolithic body. As a further example, the heat sink terminal can be formed over a top surface of the monolithic body. In some embodiments, the side surfaces of the monolithic body are free of the heat sink terminal. Further, in some embodiments the top surface of the monolithic body is free of the heat sink terminal.

FIG. 3C illustrates another embodiment of a surface mount component 300 according to aspects of the present disclosure. The heat sink terminal 116 of the surface mount component 300 can be formed over one or both of the side surfaces 302 of the surface mount component 300. In some embodiments, the heat sink terminal 116 of the surface mount component 300 can be formed over the top surface 304 of the surface mount component 300.

Figure 4A:
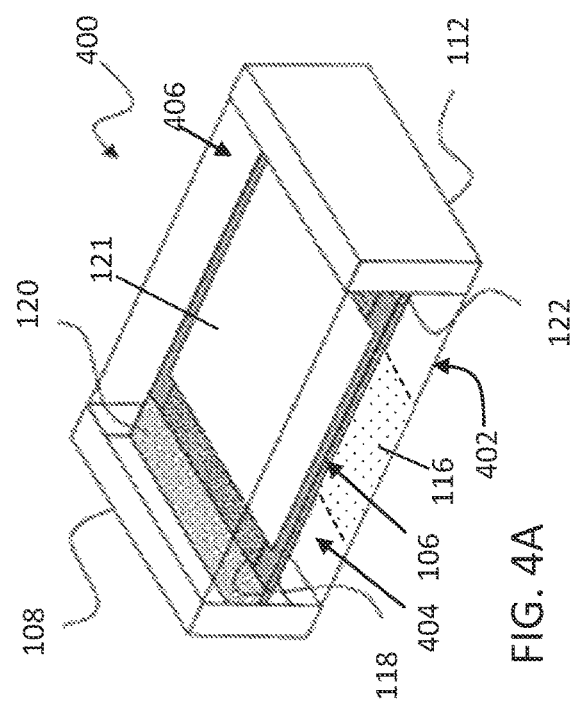
FIG. 4A is a perspective view of another embodiment of a surface mount component including a thin film component in which the heat sink terminal is formed along a bottom surface of the surface mount component in accordance with aspects of the presently disclosed subject matter.
Figure 4B:
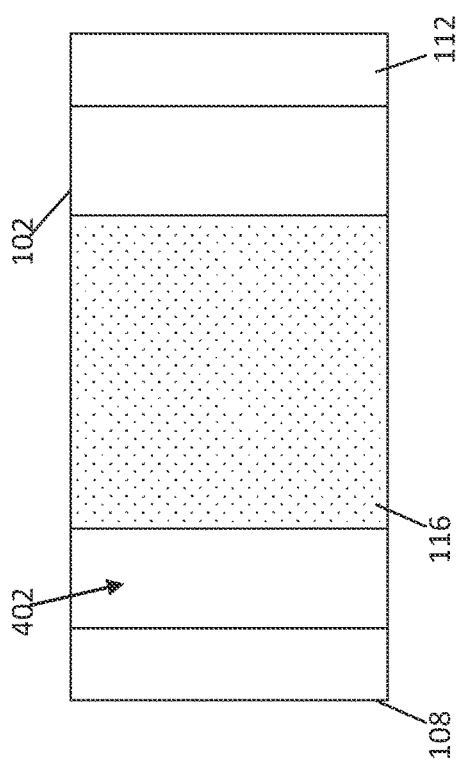
FIG. 4B is a view of the bottom surface of the surface mount component of FIG. 4A.

FIGS. 4A and 4B illustrate another embodiment of a surface mount component 400 according to aspects of the present disclosure. The heat sink terminal 116 of the surface mount component 400 can be formed over a bottom surface 402 of the surface mount component 400. In some embodiments, one or both side surfaces 404 of the surface mount component 400 can be free of the heat sink terminal 116. The top surface 406 of the surface mount component 400 can be free of the heat sink terminal 116.

Figure 5B:
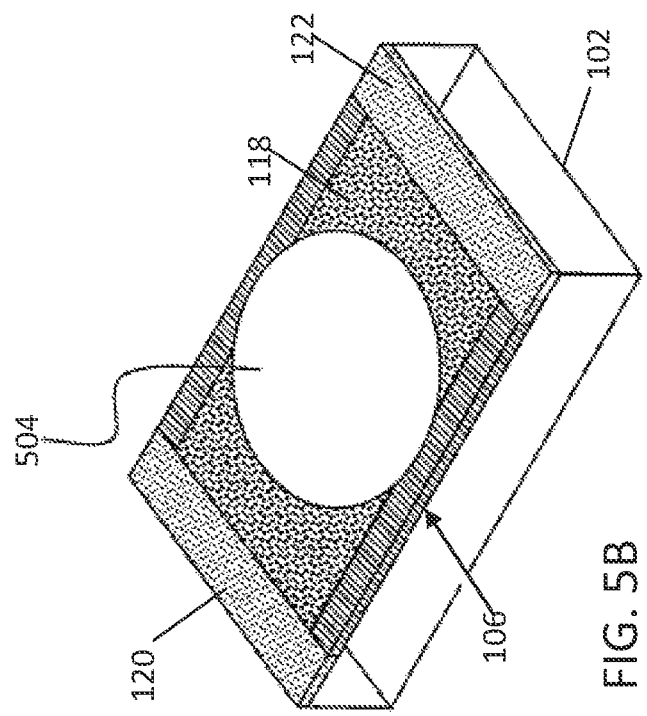
FIG. 5B is a perspective view of selected portions of an embodiment of a thin film resistor including a frequency compensating layer having a circular shape, which may be included as a part of a surface mount component in accordance with aspects of the presently disclosed subject matter.
Figure 5A:
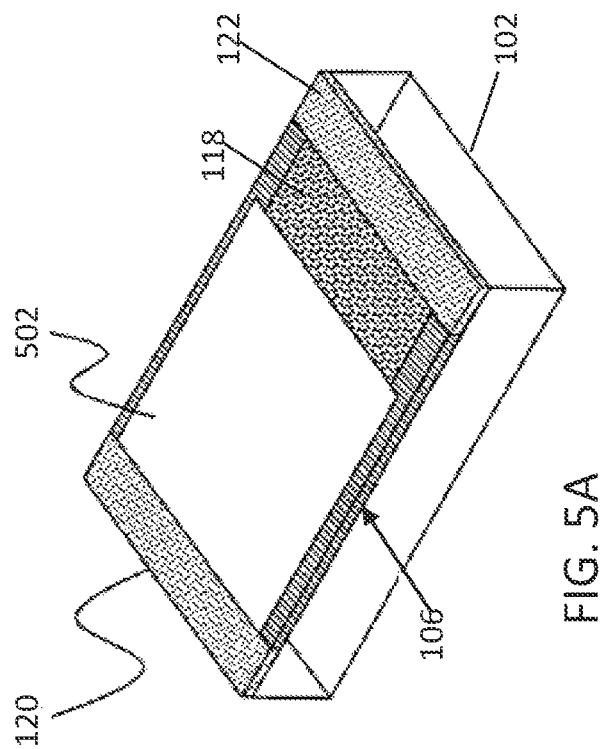
FIG. 5A is a perspective view of selected portions of an embodiment of a thin film resistor including a frequency compensating layer connected a contact pad, which may be included as a part of a surface mount component in accordance with aspects of the presently disclosed subject matter.

FIG. 5A illustrates another configuration for a frequency compensating layer 502 according to aspects of the present disclosure. In some embodiments, the frequency compensating layer 502 may be in electrical contact with one of the contact pads 120, 122, such as the contact pad 120 as shown in FIG. 5A.

FIG. 5B illustrates another configuration for a frequency compensating layer 504 according to aspects of the present disclosure. In some embodiments, the frequency compensating layer 504 may generally have a circular shape. However, the frequency compensating layer may have any shape that is suitable for providing the desired frequency compensation.

Figure 5D:
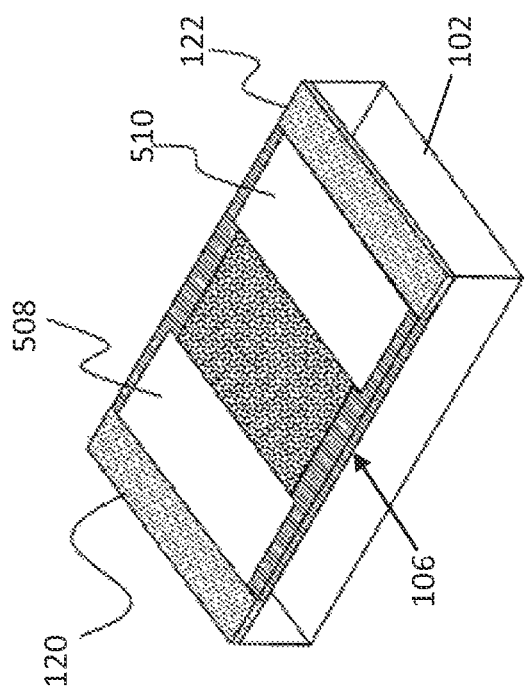
FIG. 5D is a perspective view of selected portions of an embodiment of a thin film resistor including multiple frequency compensating layers in which each frequency compensating layer is connected with a respective contact pad in accordance with aspects of the presently disclosed subject matter.
Figure 5C:
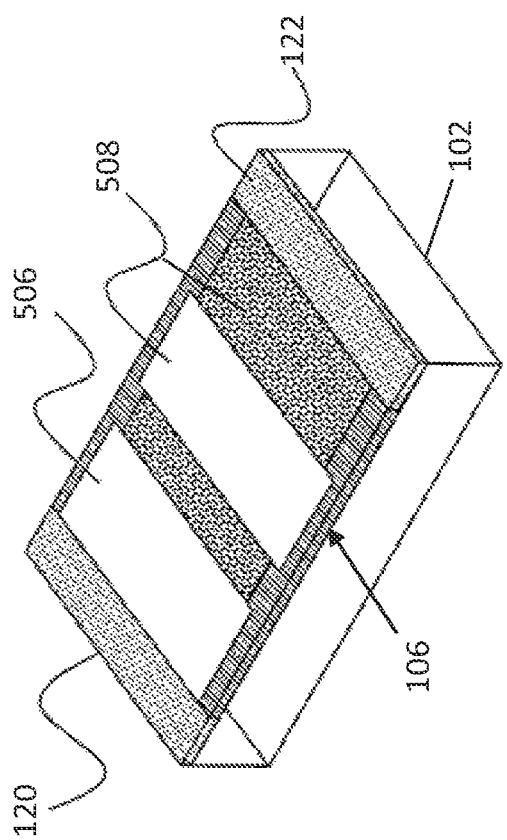
FIG. 5C is a perspective view of selected portions of an embodiment of a thin film resistor including multiple frequency compensating layers in which one frequency compensating layer is connected with a contact pad in accordance with aspects of the presently disclosed subject matter.
Figure 5F:
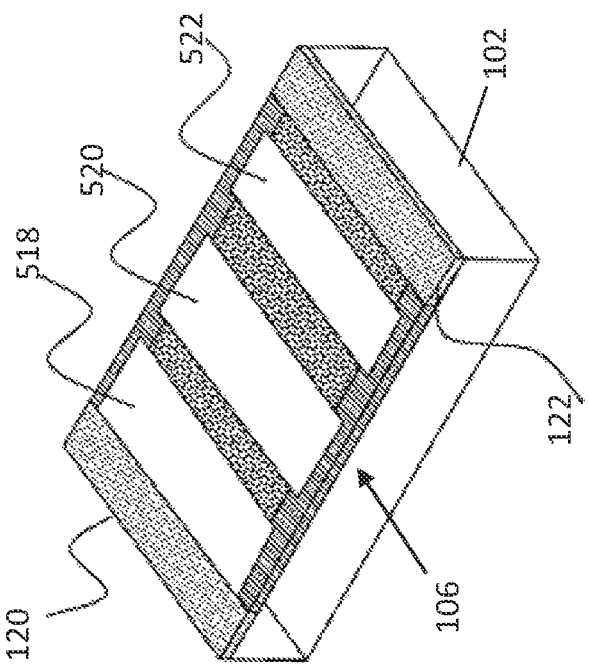
FIG. 5F is a perspective view of selected portions of an embodiment of a thin film resistor including multiple frequency compensating layers in which one frequency compensating layer is connected with a contact pad in accordance with aspects of the presently disclosed subject matter.
Figure 5E:
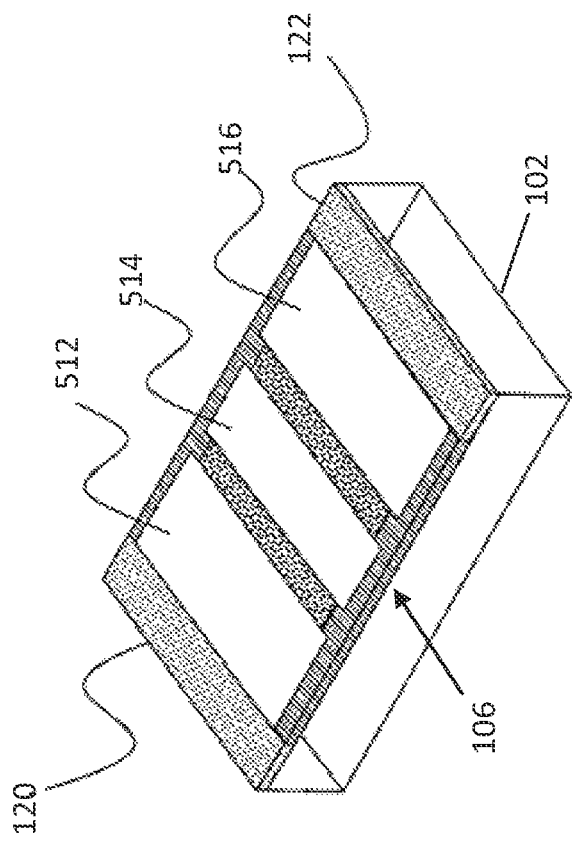
FIG. 5E is a perspective view of selected portions of an embodiment of a thin film resistor including multiple frequency compensating layers in which a respective frequency compensating layer is connected with a respective contact pad and another respective frequency compensating layer is free of connections with a contact pad in accordance with aspects of the presently disclosed subject matter.

FIG. 5C through 5E illustrate further alternative configurations in which multiple frequency compensating layers may be employed. For example, referring to FIG. 5C, in some embodiments, a first conductive layer 506 may be electrically connected with one contact pad 120 but free of electrical connection with the other contact pad 122. A second conductive layer 508 may be free of direct electrical connection with either contact pad 120, 122.

Referring to FIG. 5D, in some embodiments, frequency compensating layers 508, 510 can each be coupled electrically with a respective contact pad 120, 122. For example, a first frequency compensating layer 508 can be electrically coupled with a first contact pad 120, and a second frequency compensating layer 510 can be electrically coupled with a second contact pad 122.

Referring to FIG. 5E, in some embodiments, three frequency compensating layers 512, 514, 516 may be employed. Two of the frequency compensating layers 512, 516 may be directly electrically coupled with respective contact pads 120, 122. The third frequency compensating layer 514 may be free of direct electrical connection with the contact pads 120, 122.

Referring to FIG. 5F, in some embodiments, three frequency compensating layers 518, 520, 522 can be employed in which only one frequency compensating layer 518 is coupled with a contact pad 120. The other frequency compensating layers 520, 522 can be free of connection with the contact pads 120, 122.

Figure 6A:
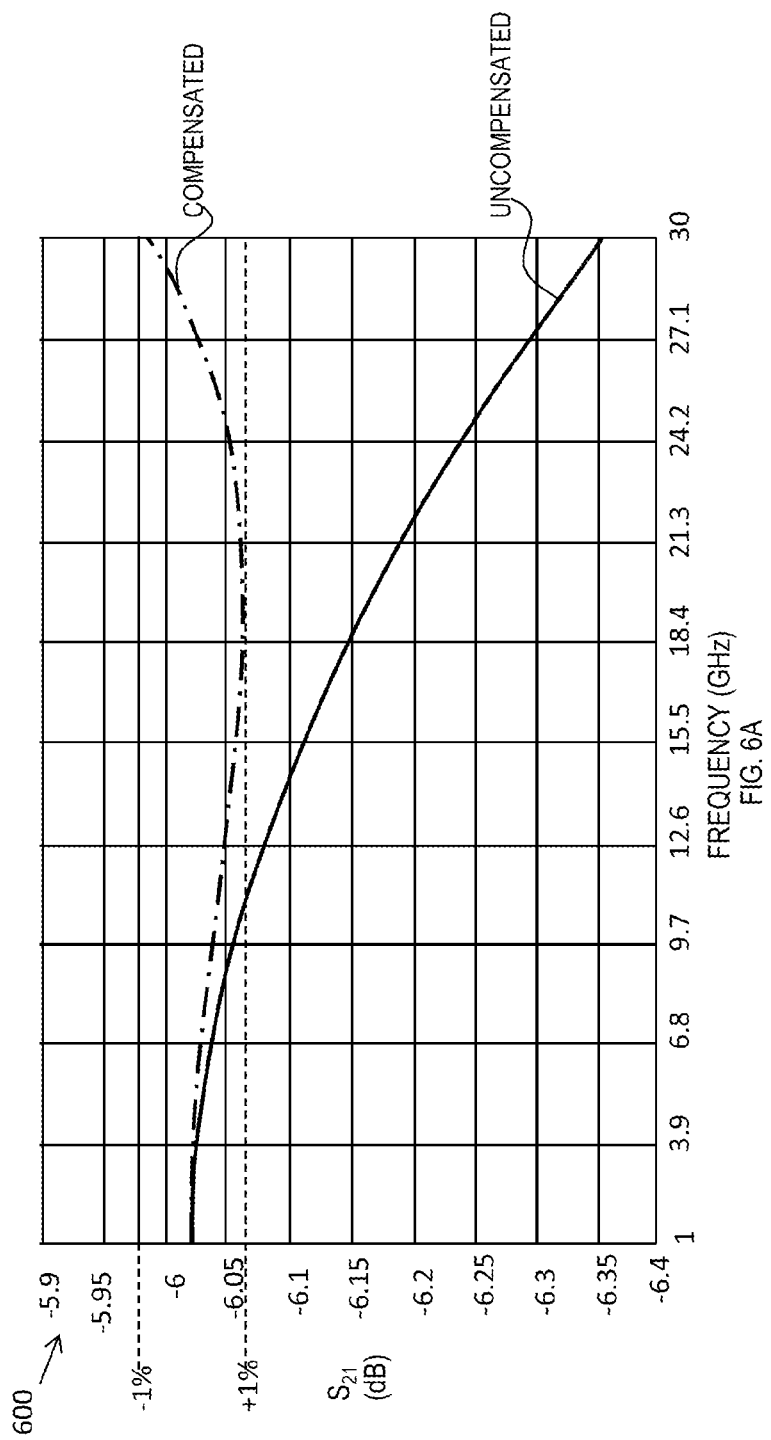
FIG. 6A is a graph of the transmission coefficient of a frequency compensated thin film resistor in accordance with aspects of the presently disclosed subject matter.

FIG. 6A illustrates a graph 600 showing compensation results obtained from an exemplary thin film resistor constructed in accordance with the presently disclosed subject matter. Graph 600 illustrates testing results for a compensated 100Ω resistor in accordance with aspects of the present disclosure in comparison with a similar uncompensated resistor. Transmission coefficient, $S_{21}$, is plotted on the vertical axis, and frequency is plotted on the horizontal axis. The uncompensated resistor exceeds a preferred ±1% deviation range at frequencies greater than about 10.5 GHz. In contrast, the compensated resistor exhibits a transmission coefficient that remains within ±1% of the transmission coefficient of the compensated resistor at 1 GHz across the tested range of 1 to 30 GHz. In other words, the transmission coefficient of the compensated resistor may vary less than 1% over the tested frequency range, 1 to 30 GHz.

Figure 6B:
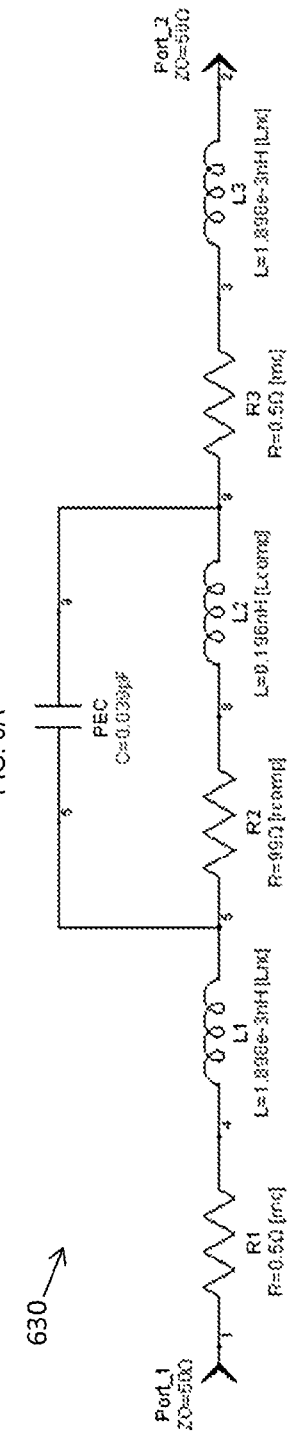
FIG. 6B is a schematic representation of an equivalent circuit of a frequency compensated thin film resistor in accordance with aspects of the present disclosure.

FIG. 6B presents an equivalent circuit 630 for illustrating frequency compensation in accordance with aspects of the present disclosure. The equivalent circuit 630 includes several ideal resistors, inductors, and capacitor components. In equivalent circuit 630, a first resistor R1 (e.g., 0.5Ω) and first inductor L1 (e.g., $1.898 \times 10^{-3}$ nH) are connected in series with the first port and each of a compensating capacitor (e.g., 0.039 pF) and a second resistor R2 (e.g., 99Ω). The compensating capacitor is in parallel with the second resistor R2 and a second inductor L2 (e.g., 0.196 nH). A third resistor R3

(e.g., 0.5Ω) is connected in series with a third inductor L3 (e.g., $1.898 \times 10^{-3}$ nH). Such equivalent circuit 630 would be most particularly representative of an appropriate equivalent circuit for the surface mount component 300 of FIGS. 1-3B, in which the frequency compensating layer 121 is not in direct electrical contact with either of the contact pads 120, 122.

Figure 7A:
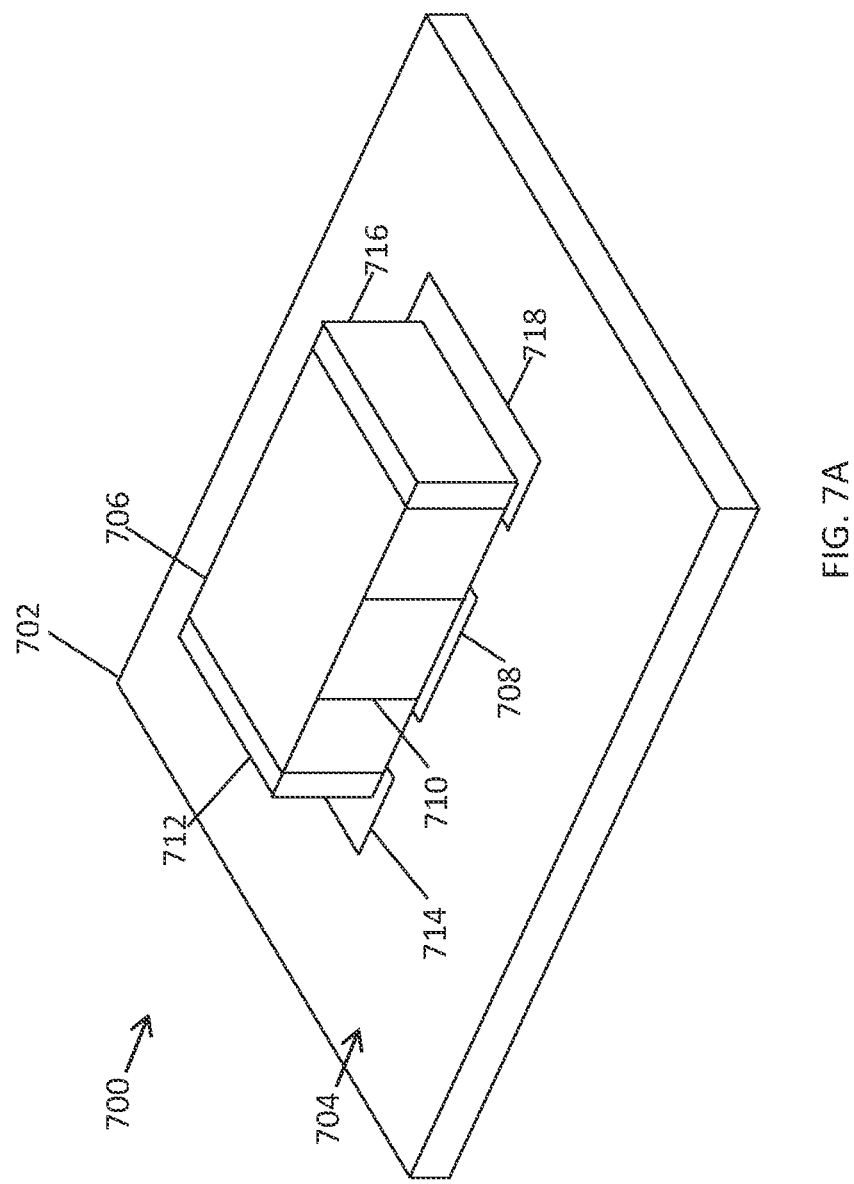
FIG. 7A illustrates a component assembly including the surface mount component of FIG. 1 mounted in a horizontal configuration according to aspects of the present invention.

FIG. 7A illustrates a component assembly 700 according to aspects of the present invention. The component assembly 700 can include a circuit board 702 having a mounting surface 704. A surface mount component 706 can be mounted to the mounting surface. In this example, the surface mount component is generally configured like the surface mount component 300 of FIGS. 1-3B and is mounted in a horizontal orientation. However, any surface mount component described herein may be employed.

The circuit board 702 can include a ground terminal 708 formed over the mounting surface 704. A heat sink terminal 710 of surface mount component 706 can be connected with the ground terminal 708 of the circuit board 702. A first terminal 712 of the surface mount component 706 can be connected with a first terminal 714 of the circuit board 702. A second terminal 716 of the surface mount component 706 can be connected with a second terminal 718 of the circuit board 702.

FIG. 7B illustrates a component assembly 750 according to aspects of the present invention. The component assembly 750 can include a circuit board 752 having a mounting surface 754. A surface mount component 756 can be mounted to the mounting surface 754. In this example, the surface mount component 756 is generally configured like the surface mount component 300 FIG. 1-3C and is mounted in a vertical orientation. However, any surface mount component described herein may be employed.

The circuit board 752 can include a ground terminal 758 formed over the mounting surface 752. A heat sink terminal 770 of surface mount component can be connected with the ground terminal 758 of the circuit board 752. A first terminal 762 of the surface mount component 756 can be connected with a first terminal 764 of the circuit board 752. A second terminal 766 of the surface mount component 756 can be connected with a second terminal 768 of the circuit board 752.

Figure 8:
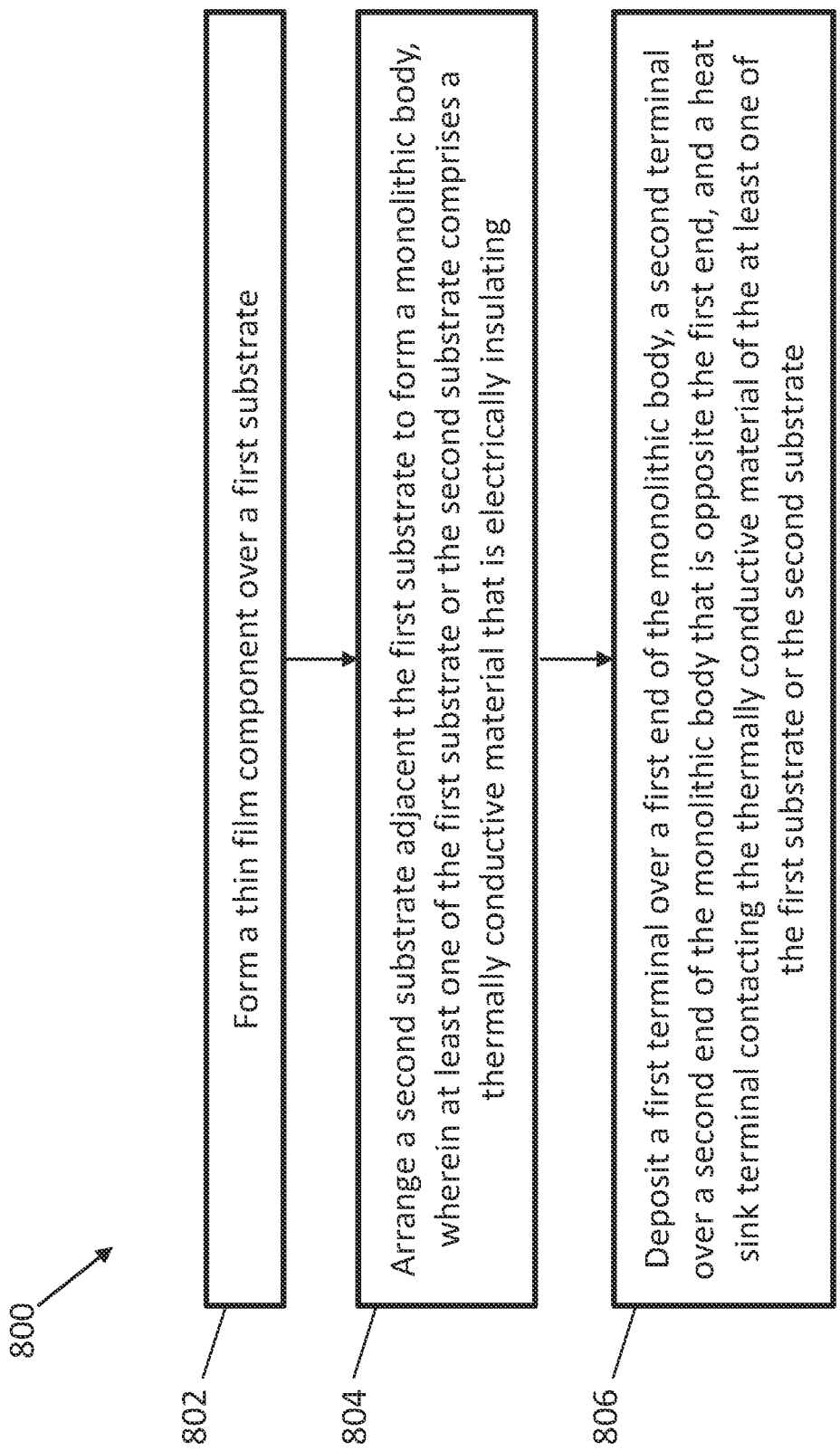
FIG. 8 is a method of forming a surface mount component in accordance with aspects of the present disclosure.

FIG. 8 is a flowchart of a method 800 of manufacturing a surface mount component according to aspects of the present disclosure. In general, the method 800 will be described herein with reference to the surface mount components 300 and 400 of FIGS. 1-4B. However, it should be appreciated that the disclosed method 800 may be implemented with any suitable heat sink component. In addition, although FIG. 8 depicts steps performed in a particular order for purposes of illustration and discussion, the methods discussed herein are not limited to any particular order or arrangement. One skilled in the art, using the disclosures provided herein, will appreciate that various steps of the methods disclosed herein can be omitted, rearranged, combined, and/or adapted in various ways without deviating from the scope of the present disclosure.

The method 800 can include, at (802), forming a thin film component over a first substrate.

The method 800 can include, at (804), arranging a second substrate adjacent the first substrate to form a monolithic body. At least one of the first substrate or the second substrate can include a thermally conductive material that is electrically insulating.

The method 800 can include, at (806), depositing a first terminal over a first end of the monolithic body; depositing a second terminal over a second end of the monolithic body that is opposite the first end; and depositing a heat sink terminal contacting the thermally conductive material of the at least one of the first substrate or the second substrate.

Applications

The various embodiments of the surface mount component described herein may find application in any suitable type of electrical component. The surface mount component may find particular application in devices that receive, transmit, or otherwise employ high frequency radio signals. Example applications include devices adapted for 5G frequencies or associated instrumentation or equipment. Additional applications can include smartphones, signal repeaters (e.g., small cells), relay stations, and radar.

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A surface mount component comprising:
a first substrate;
a second substrate arranged adjacent the first substrate to form a monolithic body, wherein at least one of the first substrate or the second substrate comprises a thermally conductive material that is electrically insulating;
a thin film component arranged between the first substrate and the second substrate;
a first terminal formed over a first end of the monolithic body;
a second terminal formed over a second end of the monolithic body that is opposite the first end; and
a heat sink terminal contacting the thermally conductive material of the at least one of the first substrate or the second substrate.

2. The surface mount component of claim 1, wherein the monolithic body has a pair of opposing side surfaces, and wherein the heat sink terminal is formed over at least one of the side surfaces of the monolithic body.

3. The surface mount component of claim 1, wherein the heat sink terminal is formed over a bottom surface of the monolithic body.

4. The surface mount component of claim 1, wherein the heat sink terminal is formed over a top surface of the monolithic body.

5. The surface mount component of claim 1, wherein side surfaces of the monolithic body are free of the heat sink terminal.

6. The surface mount component of claim 1, wherein a top surface of the monolithic body is free of the heat sink terminal.

7. The surface mount component of claim 1, wherein the thin film component comprises a thin film resistor comprising a resistive layer.

8. The surface mount component of claim 7, wherein the thin film resistor further comprises a frequency compensating conductive layer formed over the resistive layer.

9. The surface mount component of claim 1, wherein the thin film component comprises at least one of a thin film capacitor or a thin film inductor.

10. The surface mount component of claim 1, wherein the thermally conductive material has a thermal conductivity from about 150 W/m·° C. to about 300 W/m·° C. at about 22° C.

11. The surface mount component of claim 1, wherein the thermally conductive material comprises aluminum nitride.

12. The surface mount component of claim 1, wherein the thermally conductive material comprises beryllium oxide.

13. A component assembly comprising;
a circuit board having a mounting surface;
a surface mount component mounted to the mounting surface, the surface mount component comprising:
   a first substrate;
   a second substrate arranged adjacent the first substrate to form a monolithic body, wherein at least one of the first substrate or the second substrate comprises a thermally conductive material that is electrically insulating;
   a thin film component arranged between the first substrate and the second substrate;
   a first terminal formed over a first end of the monolithic body;
   a second terminal formed over a second end of the monolithic body that is opposite the first end; and
   a heat sink terminal contacting the thermally conductive material of the at least one of the first substrate or the second substrate.

14. The component assembly of claim 13, wherein the circuit board comprises a ground terminal formed over the mounting surface, and wherein the heat sink terminal of the surface mount component is connected with the ground terminal of the circuit board.

15. The component assembly of claim 13, wherein the monolithic body of the surface mount component has a pair of opposing side surfaces, and wherein the heat sink terminal is formed over at least one of the side surfaces of the monolithic body.

16. The component assembly of claim 13, wherein the heat sink terminal is formed over a bottom surface of the monolithic body.

17. The component assembly of claim 13, wherein the heat sink terminal is formed over a top surface of the monolithic body.

18. The component assembly of claim 13, wherein side surfaces of the monolithic body are free of the heat sink terminal.

19. The component assembly of claim 13, wherein a top surface of the monolithic body is free of the heat sink terminal.

20. The component assembly of claim 13, wherein the thin film component comprises a thin film resistor comprising a resistive layer.

21. The component assembly of claim 13, wherein the thin film resistor further comprises a frequency compensating conductive layer formed over the resistive layer.

22. The component assembly of claim 13, wherein the thin film component comprises at least one of a thin film capacitor or a thin film inductor.

23. The component assembly of claim 13, wherein the thermally conductive material has a thermal conductivity from about 150 W/m·° C. to about 300 W/m·° C. at about 22° C.

24. The component assembly of claim 13, wherein the thermally conductive material comprises aluminum nitride.

25. The component assembly of claim 13, wherein the thermally conductive material comprises beryllium oxide.

26. A method of forming a surface mount component, the method comprising:
forming a thin film component over a first substrate;
arranging a second substrate adjacent the first substrate to form a monolithic body, wherein at least one of the first substrate or the second substrate comprises a thermally conductive material that is electrically insulating;
depositing a first terminal over a first end of the monolithic body;
depositing a second terminal over a second end of the monolithic body that is opposite the first end; and
depositing a heat sink terminal contacting the thermally conductive material of the at least one of the first substrate or the second substrate.

* * * * *